(12) United States Patent
Frankowsky et al.

(10) Patent No.: US 7,074,696 B1
(45) Date of Patent: Jul. 11, 2006

(54) SEMICONDUCTOR CIRCUIT MODULE AND METHOD FOR FABRICATING SEMICONDUCTOR CIRCUIT MODULES

(75) Inventors: Gerd Frankowsky, Höhenkirchen-Siegertsbrunn (DE); Harry Hedler, Germering (DE); Barbara Vasquez, Orinda, CA (US)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/630,632

(22) Filed: Jul. 29, 2003

(30) Foreign Application Priority Data

Jul. 31, 2002 (DE) .............................. 102 34 951

(51) Int. Cl.
*H01L 21/00* (2006.01)
*H01L 21/44* (2006.01)
*H01L 21/46* (2006.01)

(52) U.S. Cl. .................... 438/464; 438/67; 438/68; 438/107; 438/455; 438/458

(58) Field of Classification Search ............. 438/106, 438/108, 113, 114, 125, 126, 464, 107, 67, 438/68, 458, 455
See application file for complete search history.

(56) References Cited

U.S. PATENT DOCUMENTS

| 4,635,356 A | | 1/1987 | Ohuchi et al. |
| 5,353,195 A | * | 10/1994 | Fillion et al. ............... 361/760 |
| 5,497,033 A | * | 3/1996 | Fillion et al. ............... 257/723 |
| 5,841,193 A | * | 11/1998 | Eichelberger ............... 257/723 |
| 5,937,512 A | * | 8/1999 | Lake et al. .................... 29/832 |
| 6,235,552 B1 | * | 5/2001 | Kwon et al. ................. 438/106 |
| 6,239,983 B1 | * | 5/2001 | Shingai et al. .............. 361/768 |
| 6,406,942 B1 | * | 6/2002 | Honda ......................... 438/119 |
| 6,489,185 B1 | * | 12/2002 | Towle et al. ................. 438/127 |
| 6,589,810 B1 | * | 7/2003 | Moden ........................ 438/106 |
| 6,607,938 B1 | * | 8/2003 | Kwon et al. ................. 438/109 |
| 6,721,469 B1 | * | 4/2004 | Kopp et al. .................... 385/11 |
| 6,727,576 B1 | * | 4/2004 | Hedler et al. ................ 257/678 |
| 6,734,534 B1 | * | 5/2004 | Vu et al. ...................... 257/668 |
| 2002/0036054 A1 | | 3/2002 | Nakatani et al. |

FOREIGN PATENT DOCUMENTS

EP       0 187 195       7/1986

OTHER PUBLICATIONS

Austrian Patent Office Search Report dates Oct. 7, 2005, 6 pages.

* cited by examiner

*Primary Examiner*—Carl Whitehead, Jr.
*Assistant Examiner*—J Mitchell
(74) *Attorney, Agent, or Firm*—Fish & Richardson P.C.

(57) ABSTRACT

The present invention provides a method for fabricating semiconductor circuit modules having the following steps: application of a patterned connection layer to a transfer substrate, application of active circuit devices and/or passive circuit devices with contact areas pointing toward the patterned connection layer, connection of the circuit devices to one another by means of a filler at least between the circuit devices, removal of the transfer substrate, and application of electrical connection devices for selective contact connection of the contact area of the circuit devices to one another.

9 Claims, 10 Drawing Sheets

SEMICONDUCTOR CIRCUIT MODULE AND METHOD FOR FABRICATING SEMICONDUCTOR CIRCUIT MODULES

RELATED APPLICATIONS

This application claims priority from German Application Serial No. 102 34 951.7, filed Jul. 31, 2002, the contents of which are incorporated herein by reference.

The present invention relates to a semiconductor circuit module and a method for fabricating semiconductor circuit modules.

BACKGROUND

Semiconductor devices, e.g. for use in computer systems or the memory devices thereof are usually constructed in module form. A conventional memory module essentially has two main groups of components. Firstly active and passive electrical circuit components and secondly a printed circuit board. The printed circuit board serves as a carrier for the circuit devices, provides connection elements such as conductor tracks and brings about a connection toward the outside.

Active electrical circuit devices, such as e.g. memory chips, are individual, packaged chips. The following functions are realized within the package: connection between contact pads of the chips to form a type of rewiring (leadframe, interposer board). This can be effected by means of bonding processes or by means of small solder balls as an interconnect element. This rewiring serves as a contact element for the next architectural level—connection to the application printed circuit board. Passive circuit components such as e.g. resistors, capacitors, etc. essentially serve for the external connection of the active circuit devices.

Electrical circuit components are soldered onto a circuit board during module assembly. The use of conventionally packaged active circuit devices results in a comparatively low component density and the thickness of the modules lies in the range of about 2 to 3 mm.

Figure 12:
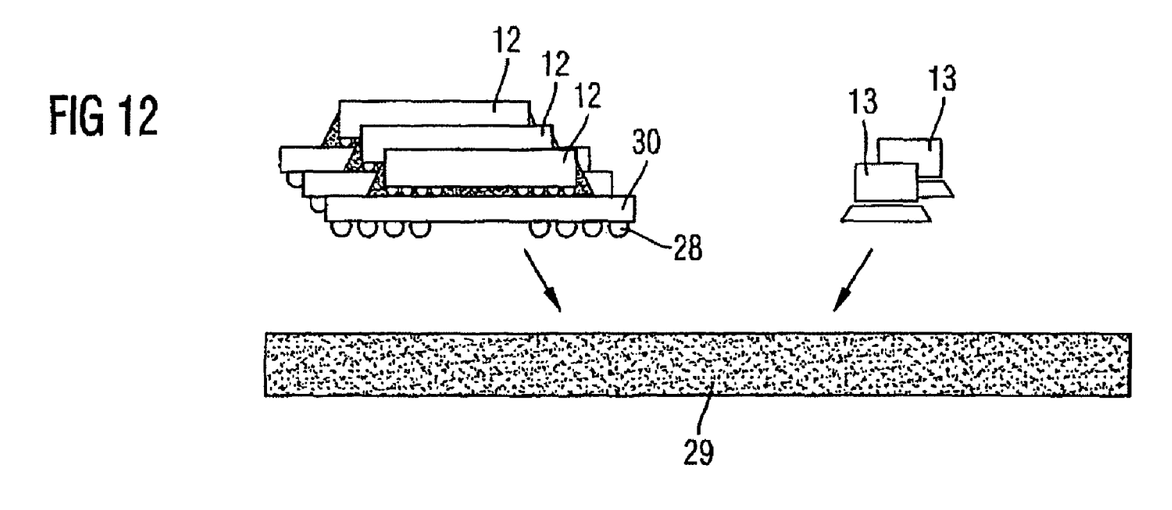
FIG. 12 shows a diagrammatic illustration for elucidating a customary arrangement.

FIG. 12 diagrammatically illustrates the population of a printed circuit board 29 with active and passive circuit devices 12, 13. Active circuit components 12, such as e.g. memory chips, are seated on an interposer substrate 30 provided with a connecting device 28, e.g. solder balls on soldering pads, for the purpose of electrical contact-connection to the printed circuit board 29. Passive circuit components 13, such as e.g. resistors, capacitors, etc., are likewise provided on the printed circuit board 29.

Figure 13:
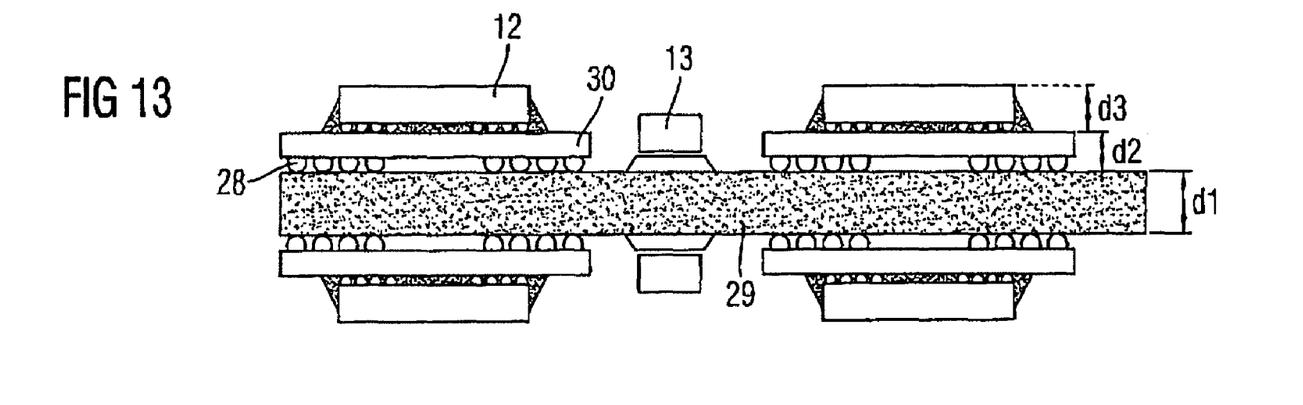
FIG. 13 shows the diagrammatic illustration of a customary multichip arrangement.

FIG. 13 shows a customary multichip module having active and passive circuit devices 12, 13 on a printed circuit board 29. The active circuit devices or chips 12 are mounted on interposer substrates 30 using flip-chip technology (and additionally underfilled=adhesively bonded owing to the thermomechanical stability). The packages comprising chips 12 and interposer substrate 30 are fixed e.g. by means of solder balls 28 on the module carrier 29. Passive circuit devices 13 are soldered onto the circuit board 29, which have a large number of electrical connections such as conductor tracks between individual chips 12 or chips 12 and passive circuit elements 13. Such a customary arrangement thus has a high total thickness of at least d1+d2+d3 in the case of only one-sided placement, which leads to a module thickness of more than 2 mm, and furthermore results in a low component density since primarily the interposer substrate and conductor tracks have a large area requirement.

Therefore, it is an object of the present invention to provide a semiconductor circuit module and a method for fabricating semiconductor circuit modules whereby thin multichip modules with a high component density can be provided.

SUMMARY

The idea on which the present invention is based consists essentially in all the module components, both active and passive circuit devices, being premounted on a particular mounting plane—called wafer hereinafter—, the packaging and the module assembly being combined in common process steps, and a module wafer being formed.

It is initially technically expedient to configure this new mounting plane in the form of a previous silicon wafer. This enables easier access to the required further process steps of thin-film technology (metallization, photolithography, . . . ), whose apparatuses already exist for the round wafers. However, the method is not dependent on this form as a mounting plane. Larger rectangular areas are more effective and likewise conceivable.

In the present invention, the problem mentioned in the introduction is solved in particular by virtue of the fact that a patterned connection layer is applied to a transfer substrate, to which layer active and/or passive circuit devices with contact areas pointing toward the transfer substrate are applied to the patterned connection layer [sic] and the circuit devices are connected to one another by means of a filler at least between the circuit devices, whereupon the transfer substrate is removed and electrical connection devices for the selective contact-connection of the contact areas of the circuit devices are applied.

On account of minimal gaps between the electrical circuit devices, a smallest possible area is taken up, and the component density is thus maximized. Furthermore, it is possible in this way to produce ultrathin modules, e.g. with 100 µm or less, on account of the use of unpackaged active circuit devices, which have a minimum of volume, weight and electrical connection planes.

Since short connection lines occur on the modules, parasitic effects such as e.g. the capacitive coupling of an undesirable signal onto a connection line, turn out to be small, which results in a good electrical performance. Moreover, it is possible to dispense with a soldering process for fabricating the semiconductor circuit module.

What is possible as a further advantage is a so-called cold and green processing or working of the semiconductor circuit module in the fabrication process, which is based on a functionally tested semiconductor device (known good die). It is also possible for modules to be stacked.

In accordance with one preferred development, a protection device is applied at least over a part of the electrical connection device. As a result, the electrical connection device is mechanically protected from external influences.

In accordance with a further preferred development, a connecting device is provided in regions not covered by the protection device.

In accordance with a further preferred development, the patterned connection layer is applied in a printing process.

In accordance with a further preferred development, the circuit devices are arranged on the patterned connection layer in such a way that the electrical contact areas of the circuit devices are not located on the patterned connection layer.

In accordance with a further preferred development, the connection layer is not cured until after the circuit devices have been applied.

In accordance with a further preferred development, during and/or after the mechanical connection of the circuit devices to one another, an encapsulation of the circuit devices is applied.

In accordance with a further preferred development, the application of the filler and/or of the encapsulation is effected in a printing, molding (plastic injection-molding) or casting process.

In accordance with a further preferred development, the filler and/or the encapsulation is cured in a curing process before the transfer substrate is removed.

In accordance with a further preferred development, the electrical connection layer is provided in at least one conductive layer and has conductor tracks in the x direction and/or conductor tracks in the y direction with an interposed insulating layer given a multilayered nature, which are in each case connected to one another selectively by means of vias.

In accordance with a further preferred development, a plurality of semiconductor circuit modules are fabricated in a parallel process at wafer level, which modules are separated into semiconductor circuit module strips or individual semiconductor circuit modules in a subsequent process step.

In accordance with a further preferred development, the connection plane comprises a dielectric material such as a polymer, epoxy resin, adhesive, silicone or polyimide.

In accordance with a further preferred development, the filler comprises a non-conductive, curable material such as a polymer, adhesive or silicone.

In accordance with a further preferred development, the encapsulation comprises the same material as the filler or the filler has additional properties.

In accordance with a further preferred development, the protection device has a passivation layer made of a non-conductive material such as a polymer.

In accordance with a further preferred development, the semiconductor circuit module has at least one conductive passage from the front side to the encapsulated rear side, by means of which passage a further semiconductor circuit module can be connected, in particular by means of a conductive adhesive.

In accordance with a further preferred development, the connecting device has an edge connector or soldering pads provided with solder balls.

In accordance with a further preferred development, the semiconductor circuit module has a total thickness of less than 200 µm, in particular a total thickness of about 100 µm.

An embodiment of the invention is illustrated in the drawings and is explained in more detail in the description below.

BRIEF DESCRIPTION OF THE DRAWINGS

In the figures, identical reference symbols designate identical or functionally identical constituent parts.

DETAILED DESCRIPTION

Figure 1A:
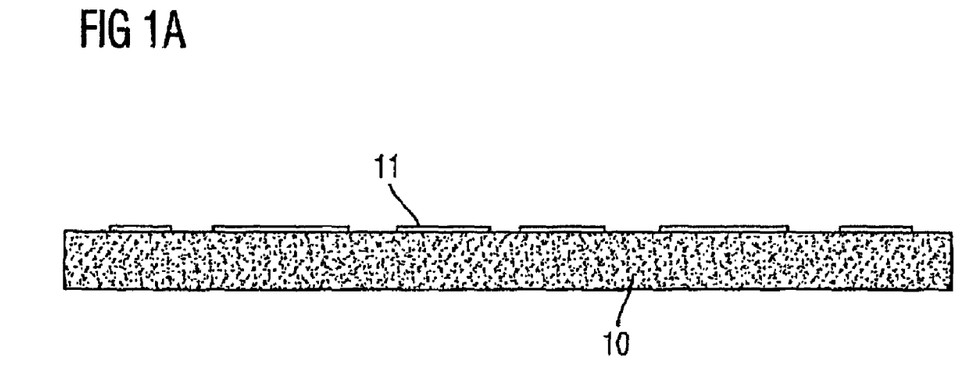
FIGS. 1A, B show the diagrammatic illustration of a detail from an arrangement after a first method step in accordance with an embodiment of the present invention, FIG. 1A illustrating a cross section and FIG. 1B illustrating a plan view.

FIG. 1A illustrates a transfer substrate 10 e.g. made of glass, metal or a polymer, to which a patterned dielectric connection plane 11 is applied in a printing process. The dielectric connection plane 11, which, at this point in time, has not yet been cured and is thus still tacky, comprises e.g. a polymer, an epoxy resin, an adhesive, silicone or a polyimide.

Figure 1B:
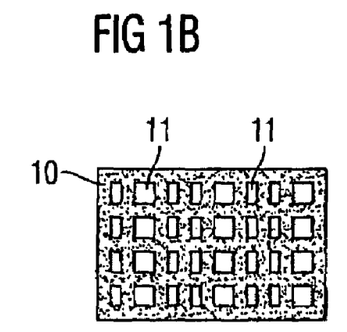

FIG. 1B shows the transfer substrate 10 with—applied thereto—individual connection areas 11 of the connection plane 11 in a plan view, the transfer substrate being embodied in rectangular fashion.

Figure 2A:
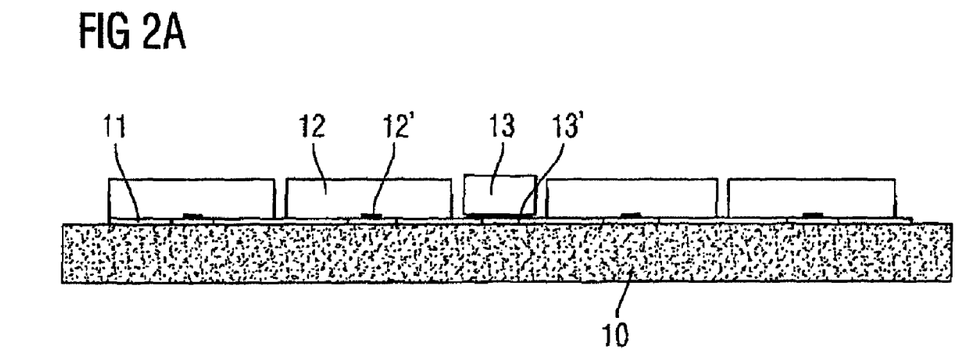
FIGS. 2A, B show the diagrammatic illustration of a detail from an arrangement after a further method step in accordance with an embodiment of the present invention, FIG. 2A illustrating a cross section and FIG. 2B illustrating a plan view.

In FIG. 2A, both active and passive circuit devices 12, 13 are applied to the transfer substrate 10 and the patterned connection plane 11. The circuit devices 12, 13 are applied to the connection plane in a predetermined position in such a way that the contact areas 12', 13' for the electrical contact-connection of the circuit devices 12, 13 point in the direction of the transfer substrate and fall on gaps or cutouts in the patterned connection plane 11. The active circuit devices 12 comprise functionally checked semiconductor devices, such as e.g. memory modules, which are arranged exactly like the passive circuit devices 13 (resistors, capacitors, . . . ) e.g. in a die-bonding or pick and place process onto the uncured adhesive 11 on the transfer substrate 10.

The geometry, i.e. the assignment of the individual circuit devices to one another, is defined in this method step. The components 12, 13 are arranged as near as possible to one another in order to take up a smallest possible area. The dielectric connection layer 11 is then cured e.g. thermally or by means of UV radiation, thereby fixing the position of the circuit devices 12, 13 with respect to one another.

Figure 2B:
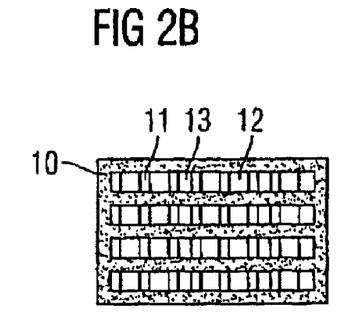

FIG. 2B shows the plan view of a connection plane 11 provided with circuit devices 12, 13 on the transfer substrate 10.

Figure 3A:
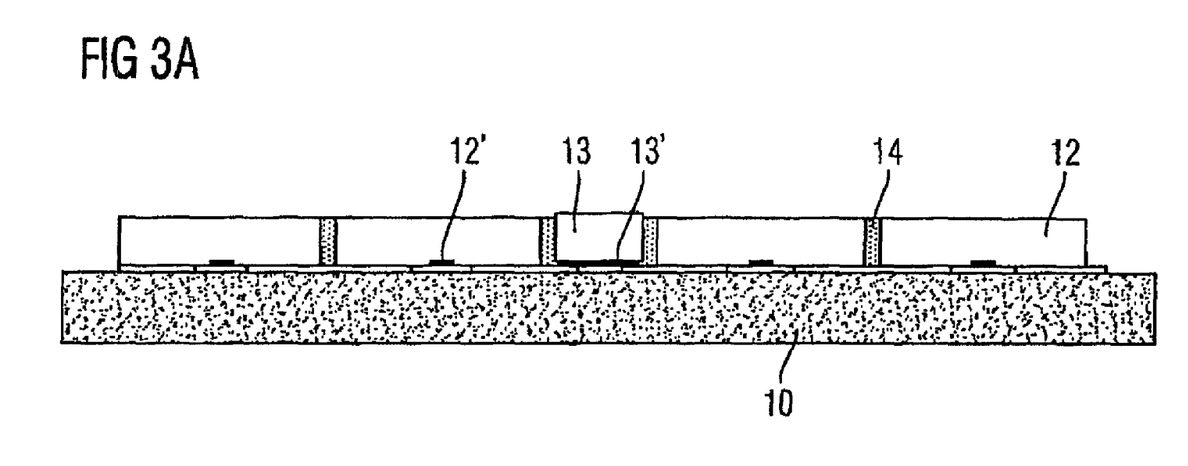
FIGS. 3A, B show the diagrammatic illustration of a detail from an arrangement after a further method step in accordance with an embodiment of the present invention, FIG. 3B illustrating the arrangement in accordance with FIG. 3A after a directly succeeding method step.

In FIG. 3A, the gaps between the semiconductor devices 12 and the passive circuit devices 13 are filled with a filler 14. The filler 14 e.g. made of a polymer, an adhesive, silicone or the like is preferably applied or introduced in a printing or casting process and then cured.

Figure 3B:
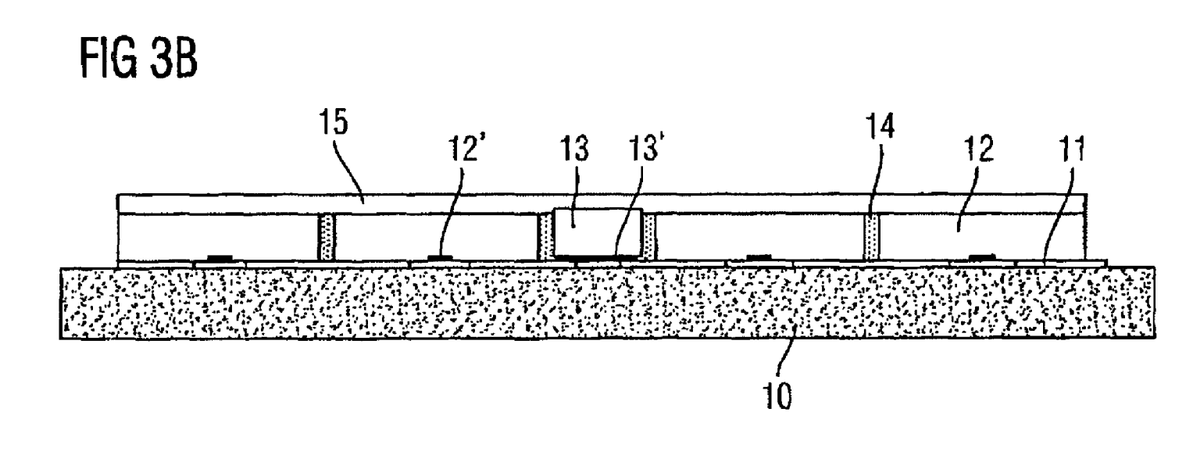

FIG. 3B illustrates an arrangement in accordance with FIG. 3A in which an encapsulation 15 is provided over the circuit devices 12, 13 and the gaps between the circuit devices 12, 13, said gaps being provided with filler 14. This rear-side encapsulation 15 may either be effected in the same step as the introduction of the filler 14 (in the same process device or chamber), but may also be effected afterward if the filler 14 is also intended to have additional properties which are not provided for the encapsulation 15.

Figure 4:
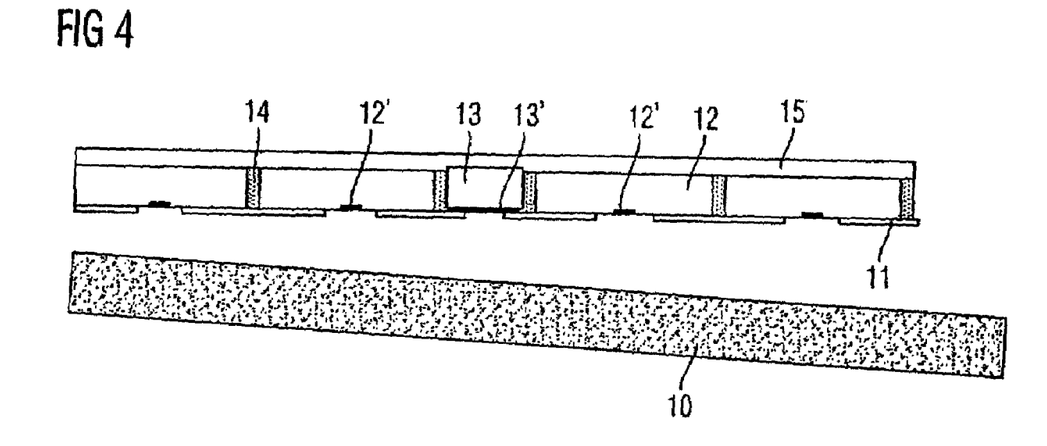
FIG. 4 shows the diagrammatic illustration of a detail from an arrangement in the case of the method step of removal of the transfer substrate in accordance with an embodiment of the present invention.

FIG. 4 illustrates the removal of the transfer substrate 10 from the cured composite comprising patterned connection plane 11, active circuit devices 12, passive circuit devices 13, gaps between the circuit devices 12, 13, said gaps being provided with filler 14, and the encapsulation 15. As a result, the contact areas 12', 13' of the circuit devices 12, 13 become accessible again.

Figure 5:
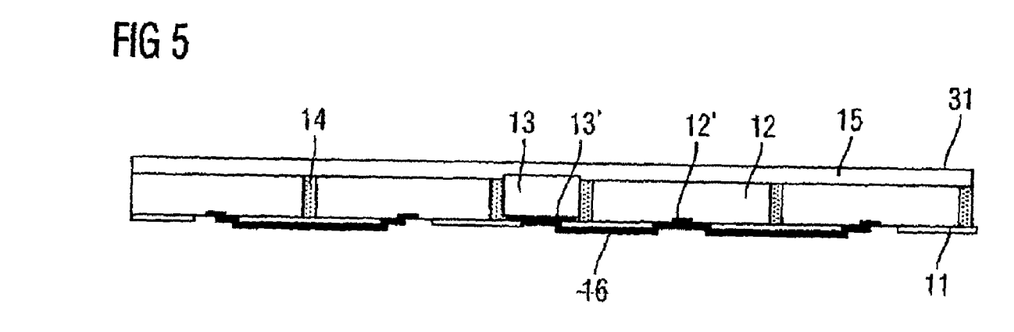
FIG. 5 shows a diagrammatic illustration of a detail from an arrangement after a further method step in accordance with an embodiment of the present invention.

In FIG. 5, the composite in accordance with FIG. 4 is provided with an electrical connection device 16 in a process step. The electrical connection device 16 comprises, for example, patterned, sputtered-on or electrochemically plated copper, nickel or gold conductor tracks which are applied between individual chips 12, chips 12 and passive circuit devices 13 and/or in a manner connected to a connecting device 19. The patterned conductor tracks 16 run between the contact areas 12', 13' over the patterned dielectric connection layer 11.

The electrical connection device 16 is preferably a double-layered line system with a dielectric layer between two patterned conductive layers, the conductive layers, one for connections or conductor tracks in the x direction, one for connections or conductor tracks in the y direction, being in electrical contact selectively by means of vias in the dielectric layer, e.g. made of polyimide. Depending on the complexity of the module, it is necessary to form one or more electrical connection devices 16 in different planes for the selective electrical connection of the components 12, 13 to one another.

Figure 6A:
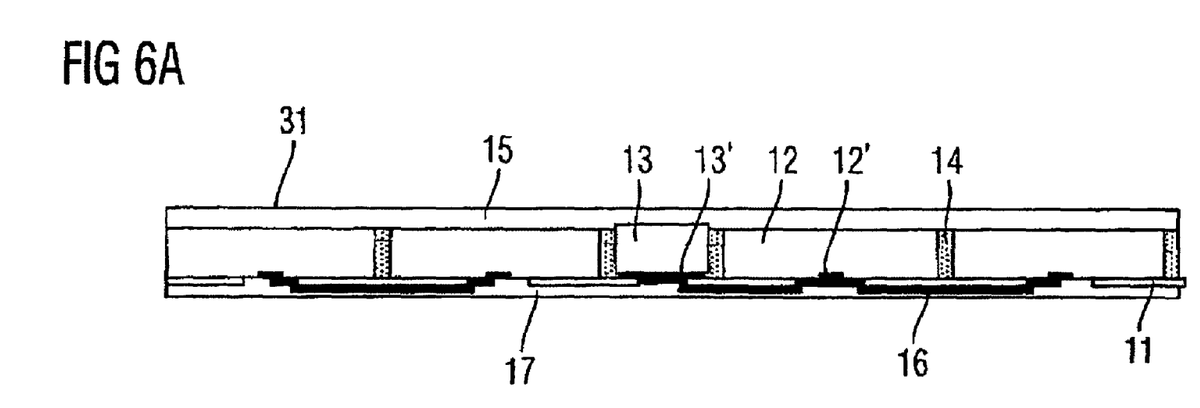
FIGS. 6A, B show the diagrammatic illustration of a detail from an arrangement after a further method step in accordance with an embodiment of the present invention, FIG. 6A illustrating a cross section and FIG. 6B illustrating a longitudinal section (turned 90°)
Figure 6B:
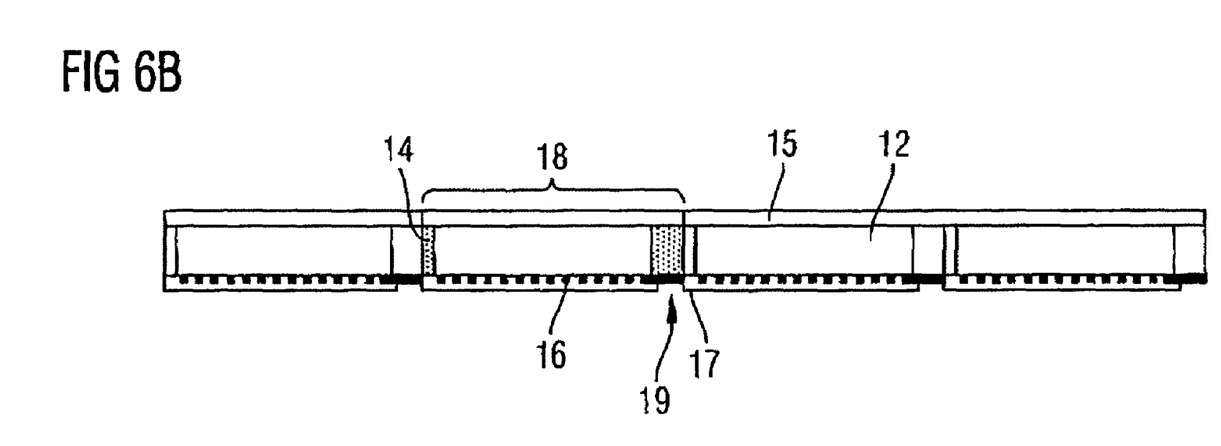

FIG. 6A shows the arrangement according to the invention in accordance with FIG. 5, but with a passivation layer 17 over the electrical connection device 16. The protection device 17 over the front side of the modules, which is applied such that it comprises a polymer e.g. in a printing process, covers the entire front side of the semiconductor circuit module 31 with the exception of a connecting device 19 or connecting contacts, illustrated in FIG. 6B. FIG. 6B shows the arrangement in accordance with FIG. 6A, but not in cross section, rather in a longitudinal section (turned through 90°).

Figure 7:
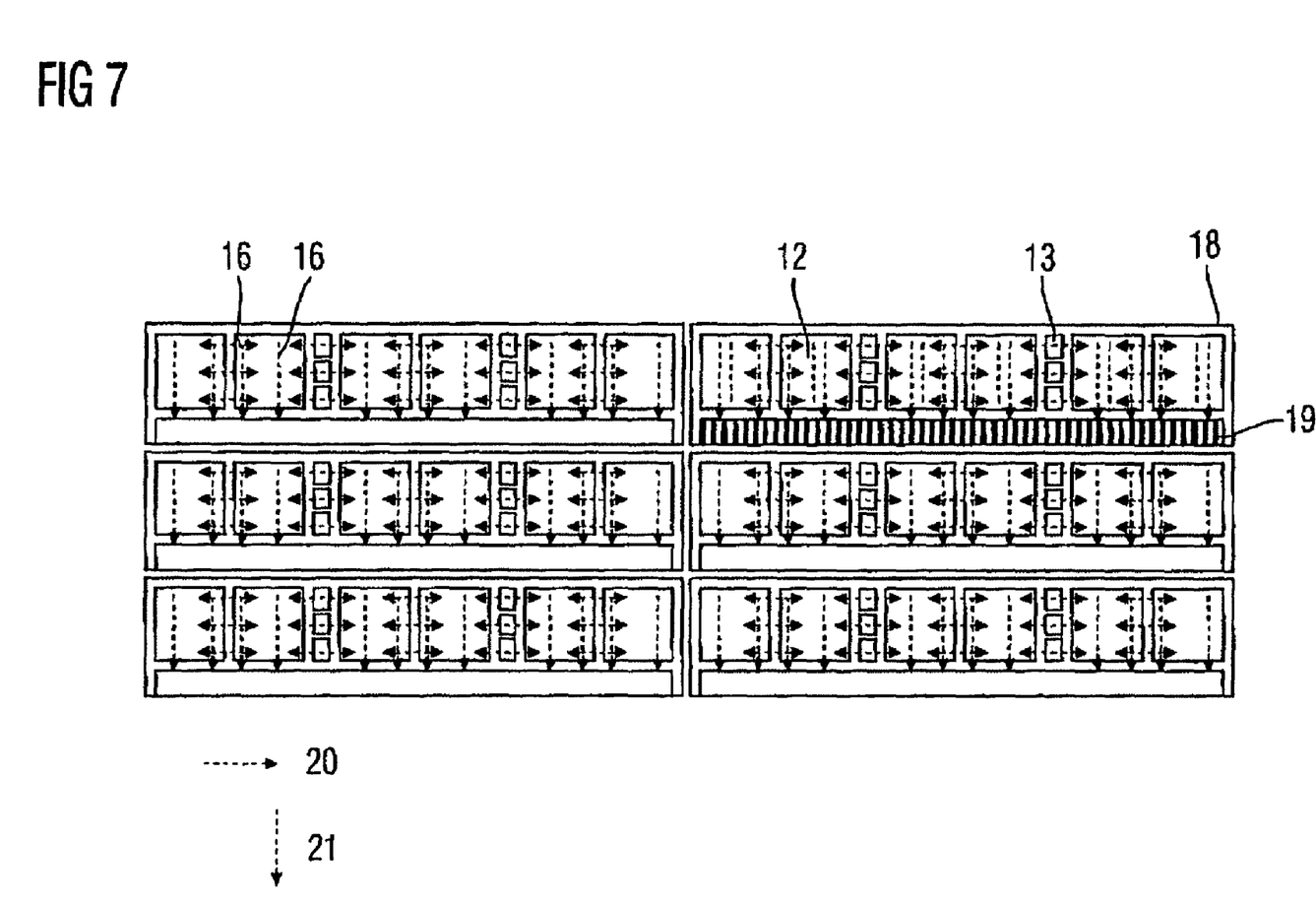
FIG. 7 shows the diagrammatic illustration of a plan view for elucidating an embodiment of the present invention.

FIG. 7 illustrates a plurality of semiconductor circuit module strips 18 in a plan view which serves to illustrate rewiring devices 20 in the x direction and rewiring device 21 in the y direction as part of the electrical connection device 16.

Figure 8A:
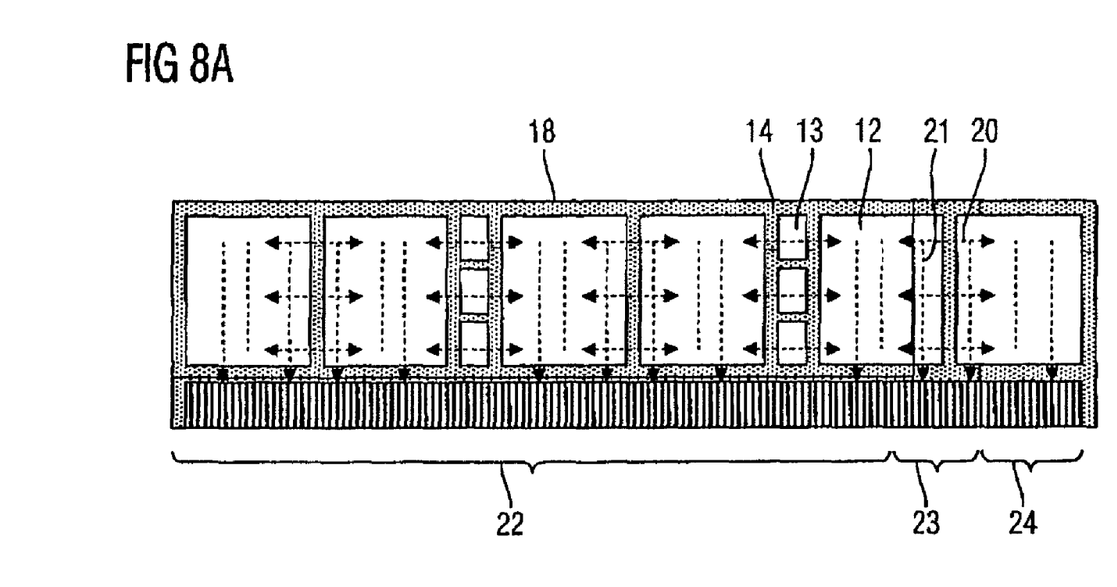
FIGS. 8A, B, C show the diagrammatic illustration of an arrangement for elucidating an embodiment of the present invention, FIG. 8A illustrating a plan view, FIG. 8B illustrating a cross section and FIG. 8C illustrating a longitudinal section of the arrangement.
Figure 8B:
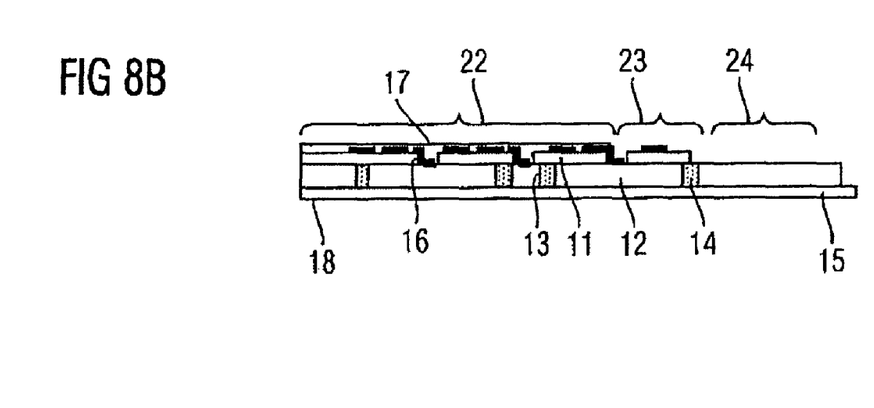
Figure 8C:
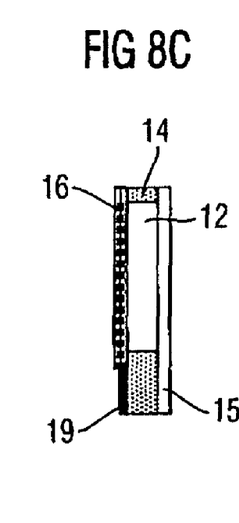

FIG. 8A shows a semiconductor circuit module strip 18 with three different sections 22, 23, 24. The section 22 represents a passivated, covered module with a passivation layer 17, which has been omitted in the region 23. Essentially the chip side walls of the embedded chip can be seen in the section 24, since here no electrical connection layer 16 or dielectric connection plane 11 is applied.

Figure 9A:
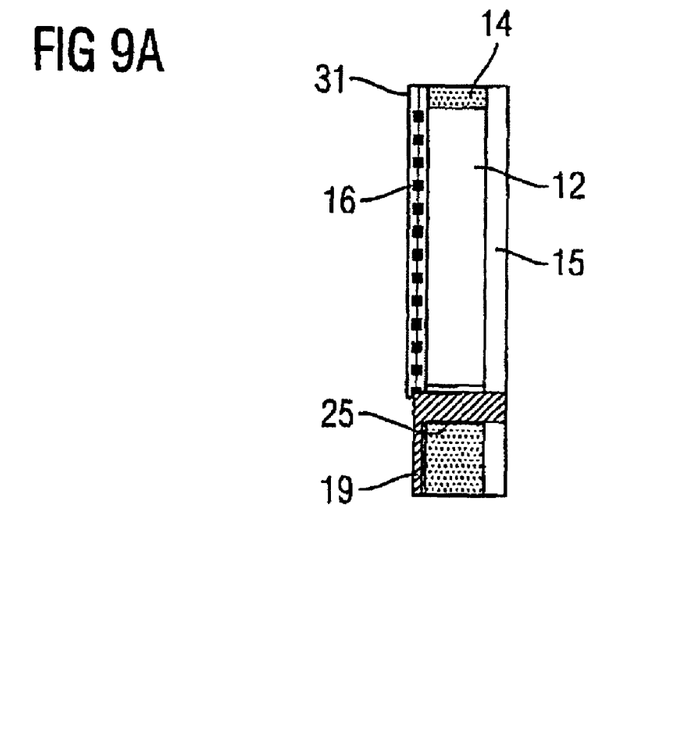
FIGS. 9A, B show the diagrammatic illustration of an arrangement in accordance with an embodiment of the present invention in longitudinal section, FIG. 9A illustrating an individual module and FIG. 9B illustrating two modules that are contact-connected to one another.
Figure 9B:
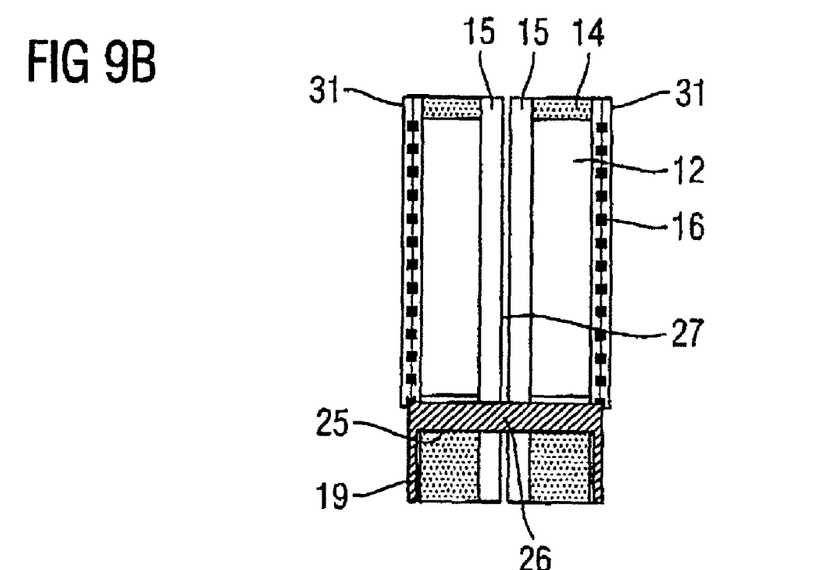

FIG. 9A illustrates the longitudinal section of a semiconductor memory module 31 provided with a conductive via 25, i.e. a plated-through hole from the front side of the module to the rear side of the module. Such a plated-through hole 25 enables, for example, the electrical linking to a second semiconductor circuit module 31 by means of an electrically conductive adhesive 26. The mechanical connection between the two semiconductor circuit modules 31 is preferably effected by means of an electrically non-conductive adhesive 27 in each case between the rear-side encapsulations 15 of the semiconductor circuit modules 31. Such a doubly stacked module comprising two semiconductor circuit modules 31 enables the component density to be increased further.

Figure 10A:
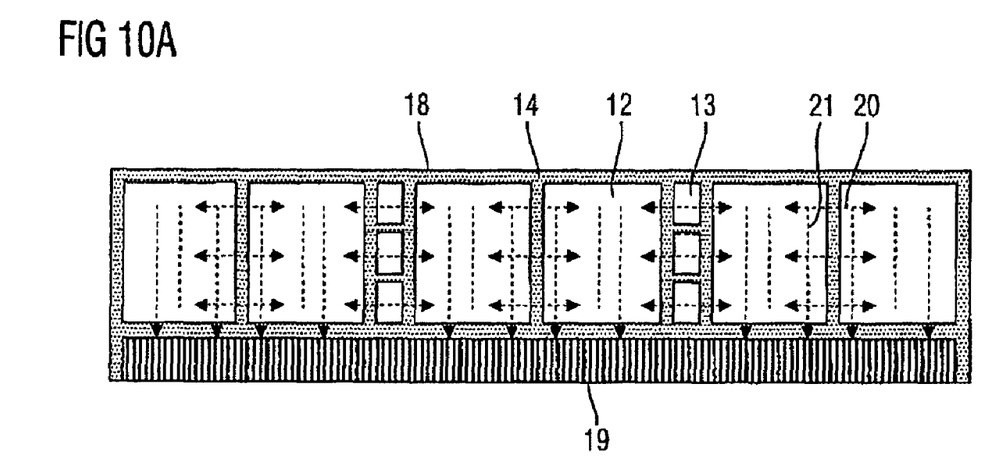
FIGS. 10A, B show the diagrammatic illustration of an arrangement in accordance with an embodiment of the present invention, FIG. 10A illustrating a plan view and FIG. 10B illustrating a longitudinal section.
Figure 10B:
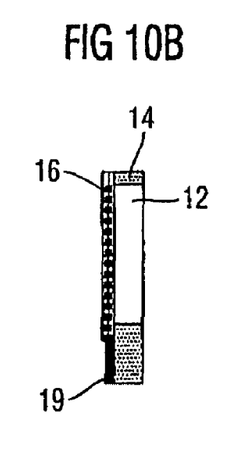

FIGS. 10A and B serve to illustrate a connecting device 19 in the form of a connecting strip or an edge connector.

Figure 11A:
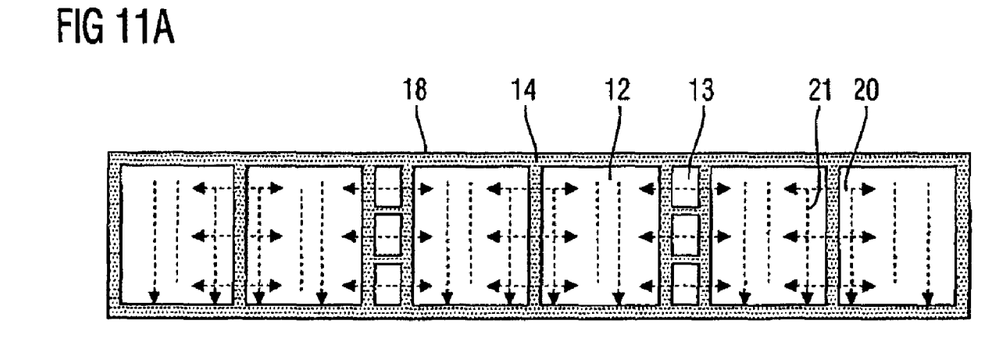
FIGS. 11A, B show the diagrammatic illustration of an arrangement in accordance with a further embodiment of the present invention, FIG. 11A illustrating a plan view and FIG. 11B illustrating a longitudinal section.
Figure 11B:
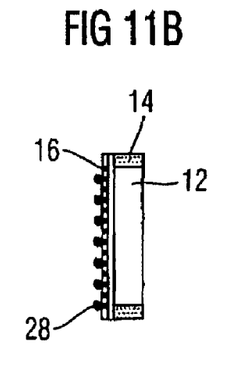

FIG. 11A shows a semiconductor circuit module strip 18 with an alternative connecting device 28 with respect to FIG. 10. The solder balls 28 applied to soldering pads represent an optimum of space saving in the x or y direction, but increase the module thickness. This results in a minimal area requirement essentially corresponding to the area of the active and passive circuit devices 12, 13.

A connecting device 19 by means of connecting contacts in the form of an edge connector can be produced in a simple manner in the formation of the electrical connection device 16 or the rewiring device 20, 21 if the layer applied last has a hard contact surface, for example made of gold. If such an edge connector is arranged outside the area taken up by the active and passive circuit devices 12, 13 in an encapsulated section, then this increases the size of the module construction.

Figure 14A:
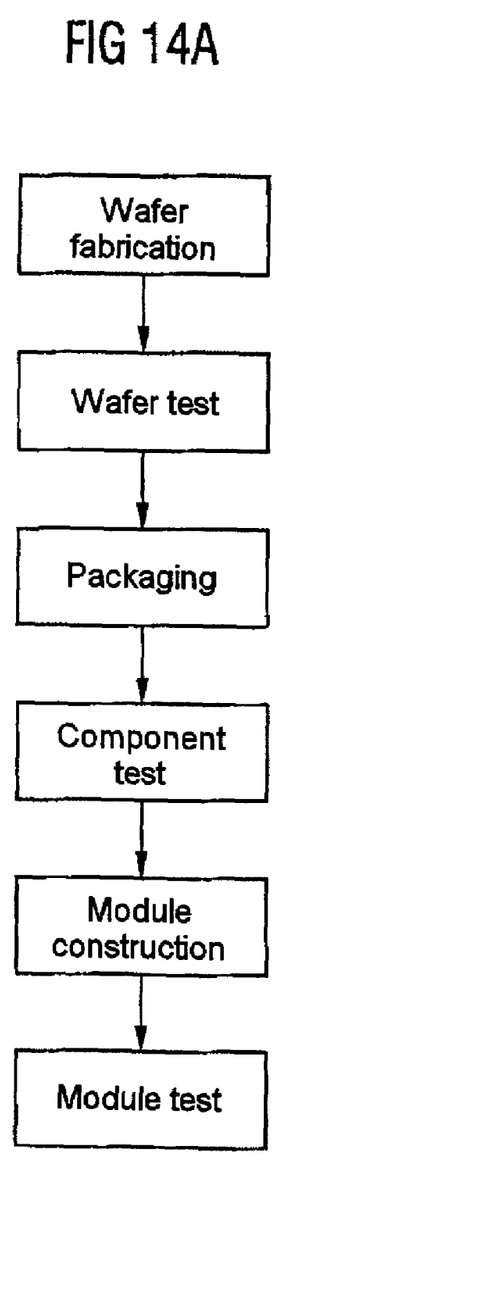
FIGS. 14A, B show a flow diagram of the fabrication process for elucidating an embodiment of the present invention, FIG. 14A illustrating a conventional fabrication method and FIG. 14B illustrating a fabrication method in accordance with an embodiment of the present invention.

FIG. 14A illustrates a conventional process sequence in the fabrication of a semiconductor circuit module. The actual wafer fabrication is followed directly by the wafer test before chips separated individually from the wafer are housed (first level packaging). This packaged component has to be checked again in respect of its functioning before it can be used to effect a module construction with further active and passive circuit devices on a printed circuit board (second level packaging). A concluding module test provides information about the functionality of the semiconductor circuit device.

Figure 14B:
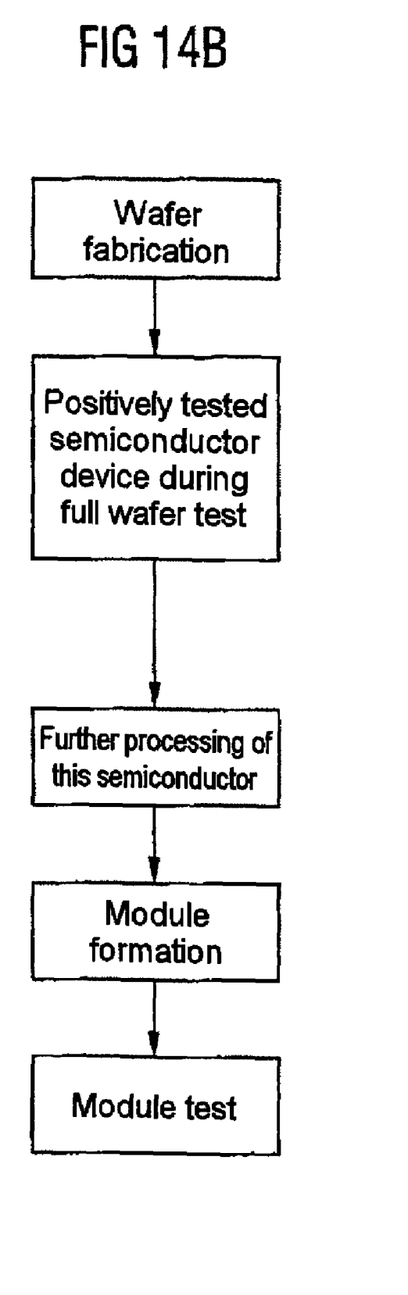

In contrast thereto, FIG. 14B illustrates a diagrammatic process sequence in accordance with an embodiment of the present invention. Here, after wafer fabrication, during a comprehensive wafer test, a semiconductor device that has been positively tested and is thus deemed to be functional, in a further step, this tested semiconductor wafer module is processed further [sic]. This is followed by module formation, which has been described in detail with reference to FIGS. 1A to 6B, before such a module likewise passes through a module test. This process sequence is based on knowledge of a good, i.e. tested semiconductor chip (known good die).

With this technology, very thin module wafers can be fabricated at low cost. Vias can be integrated into the encapsulation and an electrical connection from the front side to the rear side of the substrate/module is possible. This allows these wafers to be stacked to form a three-dimensional module. If the semiconductor devices or chips and passive circuit devices are made very thin, it is possible to achieve flexible, pliant modules which can be adapted to a housing shape in a simple manner.

Although the present invention has been described above on the basis of preferred exemplary embodiments, it is not restricted thereto, but rather can be modified in diverse ways.

Although the parallel fabrication process for many semiconductor circuit modules on a round wafer for working by means of systems appertaining to thin-film technology is envisaged, rectangular wafer configurations are also possible, which can be worked on machines used for flat screen displays or printed circuit boards. Further materials for the electrical/mechanical connection or linking of the active/passive circuit devices to one another are likewise conceivable. Moreover, the invention is not restricted to the application possibilities mentioned.

What is claimed is:

1. A method for fabricating a semiconductor circuit module, the method comprising:
   providing circuit devices, each having a contact area on a front side thereof;
   applying a patterned connection layer to a transfer substrate;
   applying the front sides of the circuit devices to the patterned connection layer and arranging said circuit devices on said pattern connection layer, such that the contact areas of said devices are not located on said patterned connection layer;
   curing the patterned connection layer after applying said circuit devices;
   applying a filler between the circuit devices;
   removing the transfer substrate; and
   applying an electrical connection device on said patterned connection layer to connect the circuit devices after removing said transfer substrate.

2. The method according to claim 1, further comprising applying a protection layer at least partially covering the electrical connection device.

3. The method according to claim 2, further comprising providing a second electrical connection device in a region not covered by the protection layer.

4. The method according to claim 1, wherein applying the patterned connection layer comprises printing the patterned connection layer on the transfer substrate.

5. The method according to claim 1, further comprising providing an encapsulation layer on backsides of said circuit devices.

6. The method according to claim 5, wherein applying the encapsulation layer comprises selecting a process from the group consisting of casting and printing.

7. The method according to claim 5, further comprising curing said encapsulation layer before removing said transfer substrate.

8. The method according to claim 1, wherein applying the filler comprises selecting a process from the group consisting of casting and printing.

9. The method according to claim 1, further comprising curing said filler before removing said transfer substrate.

* * * * *